(12) United States Patent
Ko

(10) Patent No.: US 7,573,100 B2
(45) Date of Patent: Aug. 11, 2009

(54) HIGH VOLTAGE SEMICONDUCTOR DEVICE AND METHOD FOR FABRICATING THE SAME

(75) Inventor: Kwang Young Ko, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 207 days.

(21) Appl. No.: 11/637,704

(22) Filed: Dec. 13, 2006

(65) Prior Publication Data

US 2007/0138551 A1 Jun. 21, 2007

(30) Foreign Application Priority Data

Dec. 14, 2005 (KR) ...................... 10-2005-0123358

(51) Int. Cl.
H01L 27/108 (2006.01)
H01L 29/94 (2006.01)

(52) U.S. Cl. ...................... 257/339; 257/333; 257/330; 438/151

(58) Field of Classification Search ................. 257/344, 257/336, 367, E29.256, E29.012, E29.009, 257/330, 333, 339; 438/151, 163, 175
See application file for complete search history.

(56) References Cited

U.S. PATENT DOCUMENTS

| | | | | |
|---|---|---|---|---|
| 6,232,636 B1 * | 5/2001 | Simpson et al. | ............. | 257/347 |
| 7,064,385 B2 * | 6/2006 | Dudek et al. | ................ | 257/335 |
| 7,187,033 B2 * | 3/2007 | Pendharkar | ................ | 257/339 |
| 7,224,025 B2 * | 5/2007 | Tsai et al. | .................... | 257/335 |
| 7,247,507 B2 * | 7/2007 | Sung | ............................. | 438/8 |
| 2005/0001265 A1 * | 1/2005 | Shiraki et al. | ............... | 257/330 |
| 2006/0148110 A1 * | 7/2006 | Sung | ............................. | 438/8 |

* cited by examiner

*Primary Examiner*—S. V Clark
(74) *Attorney, Agent, or Firm*—Finnegan, Henderson, Farabow, Garrett & Dunner, L.L.P.

(57) ABSTRACT

There is provided a high voltage semiconductor device comprising: a semiconductor substrate of a first conductivity type, including a first region, a second region relatively lower than the first region, and a sloped region between the first region and the second region; a drift region of a second conductivity type, formed on the second region; a source region of the second conductivity type, disposed on the first region, and spaced apart from the drift region by the sloped region; a drain region of the second conductivity type, disposed on the drift region; a field plate positioned on the drift region in the second region; a gate insulating layer disposed between the source region and the drift region; and a gate electrode layer, which is disposed on the gate insulating layer and extends to above the field plate.

6 Claims, 3 Drawing Sheets

HIGH VOLTAGE SEMICONDUCTOR DEVICE AND METHOD FOR FABRICATING THE SAME

RELATED APPLICATION

This application is based upon and claims the benefit of priority to Korean Application No. 10-2005-0123358, filed on Dec. 14, 2005, the entire contents of which are incorporated herein by reference.

TECHNICAL FIELD

The present invention relates to a semiconductor device and a method for fabricating the same, and more particularly, to a high voltage semiconductor device having a low operation resistance and a method for fabricating the same.

BACKGROUND

FIG. 1 is a sectional view illustrating an example of a conventional high voltage semiconductor device.

Referring to FIG. 1, an n-type drift region 110 is disposed at a predetermined region on a p-type semiconductor substrate 110. An $n^+$-type source region 121 is disposed on the surface of semiconductor substrate 100, and spaced apart from n-type drift region 110 at a predetermined interval. An $n^+$-type drain region 122 is disposed on n-type drift region 110. A channel region 102 is disposed on the surface of semiconductor substrate 100 between n-type drift region 100 and $n^+$-type source region 121, and an inversion layer is formed in channel region 102 under a predetermined condition. A local oxidation of silicon (LOCOS) field plate 130 is disposed on n-type drift region 110 between channel region 102 and $n^+$-type drain region 122.

A gate electrode layer 150 is disposed above channel region 102, where a gate insulating layer 140 is interposed therebetween. Gate electrode layer 150 extends to the top surface of field plate 130 on n-drift region 110. Gate spacer layers 160 are formed at both sidewalls of gate electrode layer 150. $n^+$-type source region 121, $n^+$-type drain region 122, and gate electrode layer 150 are respectively connected to a source terminal S, a drain terminal D, and a gate terminal G through their interconnection structures.

In the aforementioned high voltage semiconductor device, to secure a breakdown voltage (BV), n-type drift region 110 is required, and the length of channel needs to be long. n-type drift region 110 and the long channel occupy a majority of surface area of the high voltage semiconductor device. Moreover, when field plate 130 is employed, a current passing path is formed in n-type drift region 110, along the bottom surface of field plate 130, as indicated by an arrow in FIG. 1. Accordingly, the relatively lengthened current path and the increased ON-resistance (Ron) of the semiconductor device deteriorate the operation performance of the semiconductor device.

SUMMARY

Consistent with the present invention, there is provided a high voltage semiconductor device which may improve the operation performance of the semiconductor device by decreasing the ON-resistance of the semiconductor device.

Consistent with the present invention, there is also provided a method for fabricating the aforementioned high voltage semiconductor device.

In accordance with a preferred embodiment of the present invention, there is provided a high voltage semiconductor device comprising: a semiconductor substrate of a first conductivity type, including a first region with a relatively high step, a second region with a relatively low step, and a sloped region between the first region and the second region; a drift region of a second conductivity type, formed on the second region; a source region of the second conductivity type, disposed on the first region and spaced apart from the drift region by the sloped region; a drain region of the second conductivity type, disposed on the drift region; a field plate disposed on the drift region at the second region; a gate insulating layer disposed between the source region and the drift region; and a gate electrode layer which is disposed on the gate insulating layer and extends to the top surface of the field plate.

The first conductivity type may be p-type and the second conductivity type may be n-type.

In accordance with another preferred embodiment of the present invention, there is provided a method of fabricating a high voltage semiconductor device, comprising: forming a drift region of a second conductivity type, on a predetermined region of a semiconductor substrate of a first conductivity type; forming a local oxidation of silicon (LOCOS) field plate on the surface of the semiconductor substrate contacting with the drift region, both sides of the LOCOS field plate being sloped; exposing the semiconductor substrate at a sloped part of one side of the field plate by patterning the field plate; forming a gate conductivity type layer pattern by interposing a gate insulating layer so as to be superposed with a sloped part of one side of the semiconductor substrate which is exposed by patterning the field plate; and forming source/drain regions respectively disposed in the semiconductor substrate and the drift region.

Preferably, the gate conductive layer pattern may be formed to extend to the top surface of the field plate.

The first conductivity type may be p-type and the second conductivity type may be n-type.

BRIEF DESCRIPTION OF THE DRAWINGS

The features of the present invention will become apparent from the following description of preferred embodiments given in conjunction with the accompanying drawings, in which.

DETAILED DESCRIPTION

Hereinafter, embodiments consistent with the present invention will be described in detail with reference to the accompanying drawings so that they can be readily implemented by those skilled in the art. This invention may, however, be embodied in many different forms and should not be construed as being limited to the embodiments set forth herein.

Figure 2:
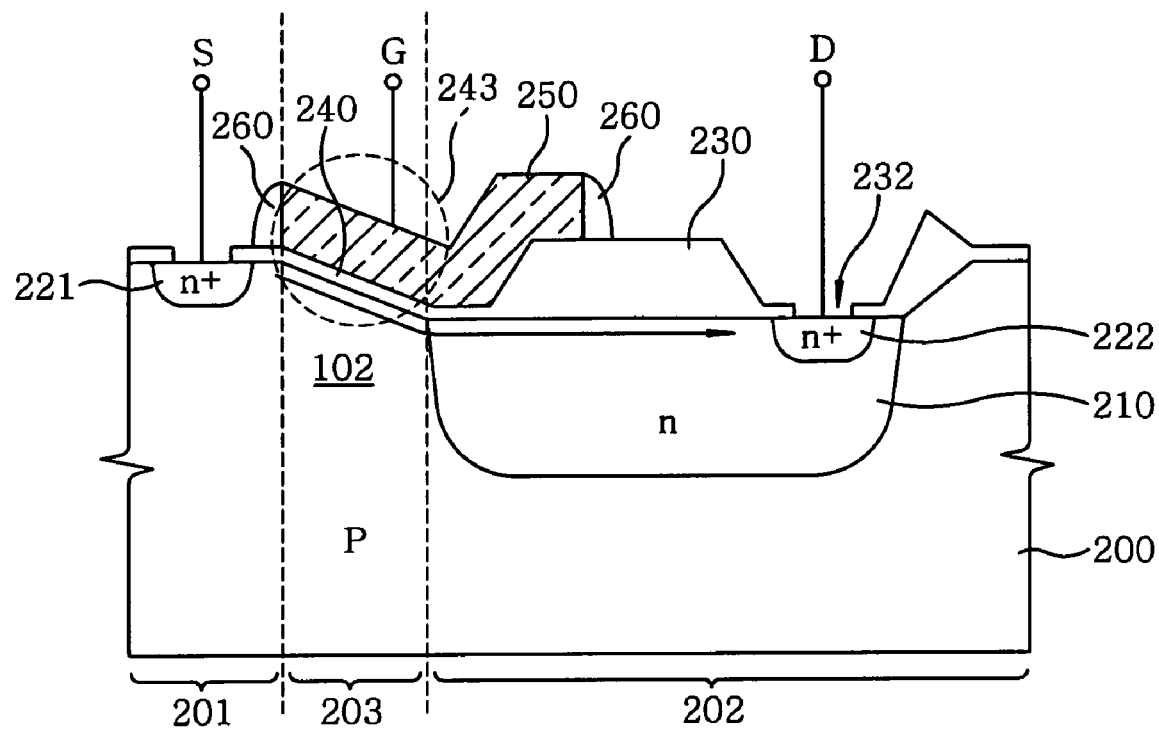
FIG. 2 is a sectional view illustrating a high voltage semiconductor device, consistent with an embodiment of the present invention.

FIG. 2 is a sectional view illustrating a high voltage semiconductor device, consistent with an embodiment of the present invention.

Referring to FIG. 2, a first conductivity type semiconductor substrate, i.e., a p-type semiconductor substrate 200 includes a first region 201, a second region 202 relatively lower than first region 201, and a third region 203 connecting first region 201 and second region 202. A second conductivity type drift region, i.e., an n-type drift region 210 is disposed at a predetermined location above second region 202 of semiconductor substrate 200. A second conductivity type drain region, i.e., an $n^+$-type drain region 222 with a high concentration is disposed at a predetermined location above drift region 210.

A field plate 230 is disposed on the top surface of second region 202 of semiconductor substrate 200. Field plate 230 may be formed of an oxide layer, and includes an opening 232 to expose a contact formation region of n+-type drain region 222.

An n+-type source region 221 is disposed at first region 201 of semiconductor substrate 200. In connecting first region 201 and second region 202, a step 243 is formed between n+-type source region 221 and n-type drift region 210. As described above, n+-type source region 221 is disposed relatively higher than n-type drift region 210. Third region 203, being sloped, is disposed between n+-type source region 221 and n-type drift region 210, and becomes a channel region 102 where an inversion layer is formed under predetermined conditions, i.e., when a gate voltage is applied.

A gate insulating layer 240 is disposed on channel region 102, and a gate conductive layer pattern 250 is disposed on gate insulating layer 240. Gate insulating layer 240 may be formed of an oxide layer, and gate conductive layer pattern 250 is formed of a polysilicon layer. A portion of gate conductive layer pattern 250 is disposed on the top surface of field plate 230. Gate spacer layers 260 are disposed at both sidewalls of gate conductive layer pattern 250. Gate spacer layers 260 may be formed of nitride layers. n+-type source region 221, n+-type drain region 222 and gate conductive layer pattern 250 are respectively connected to a source terminal S, a drain terminal D and a gate terminal G using metal wires.

Figure 1:
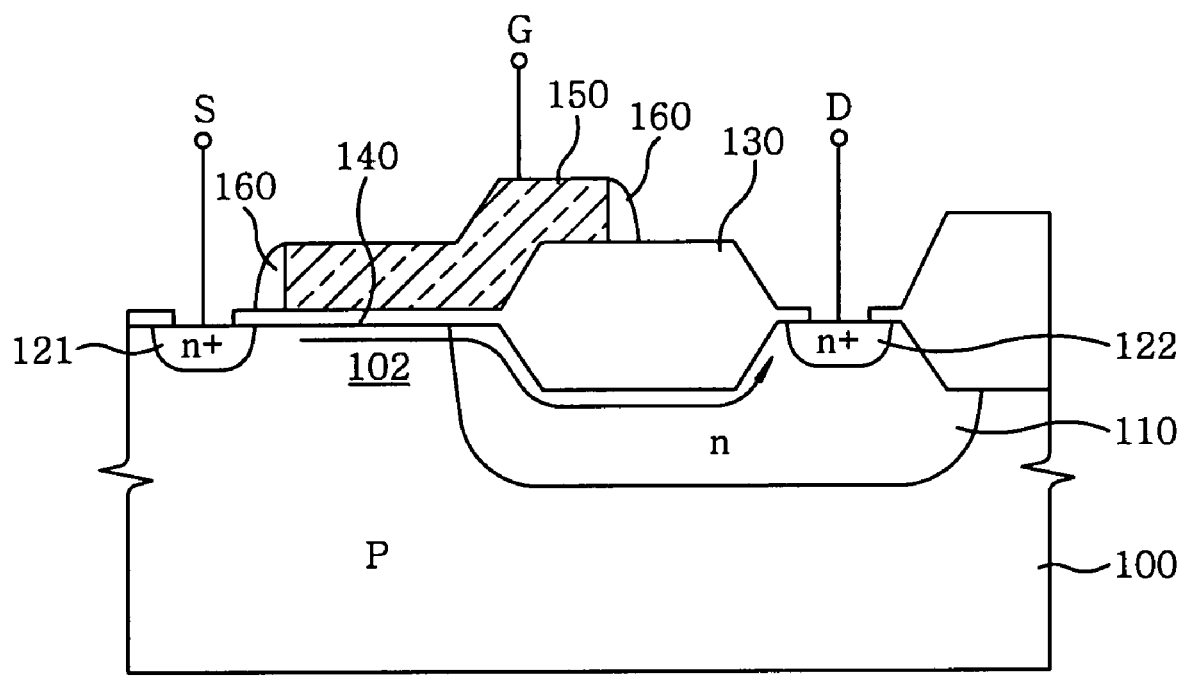
FIG. 1 is a sectional view illustrating an example of a conventional high voltage semiconductor device.

In the high voltage semiconductor device consistent with an embodiment of the present invention, n+-type source region 221 is disposed higher than n-type drift region 210. Channel region 102 has a sloped profile between n+-type source region 221 and n-type drift region 210. Accordingly, in contrast to FIG. 1, the current passes below field plate 230 in a horizontal direction without detouring around the field plate 230. The current path, which is indicated by an arrow in FIG. 2, is thus shortened, thereby decreasing the ON resistance of the semiconductor device.

Figure 3:
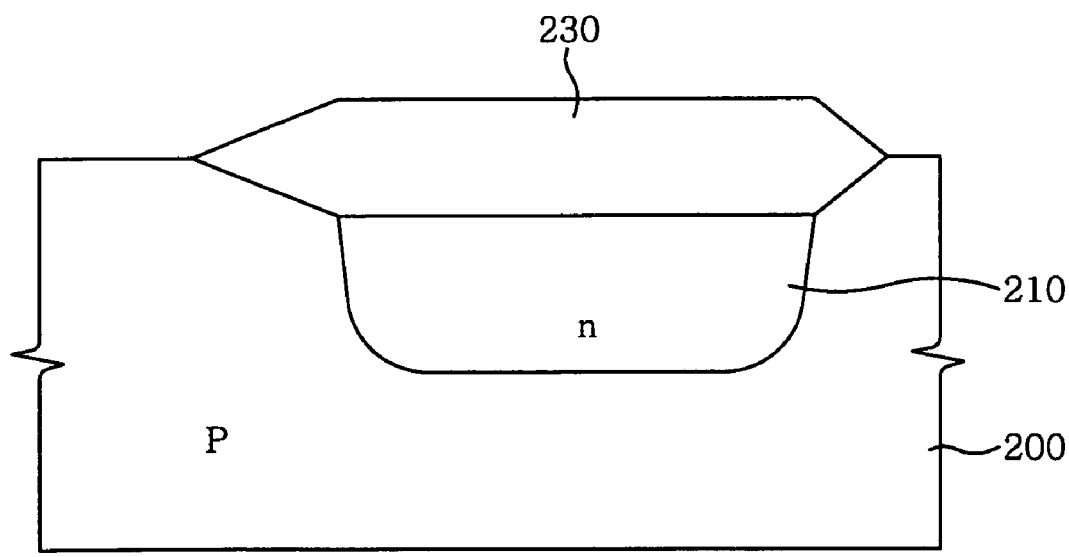
FIGS. 3 to 5 are sectional views illustrating a method for fabricating a high voltage semiconductor device, consistent with an embodiment of the present invention.
Figure 4:
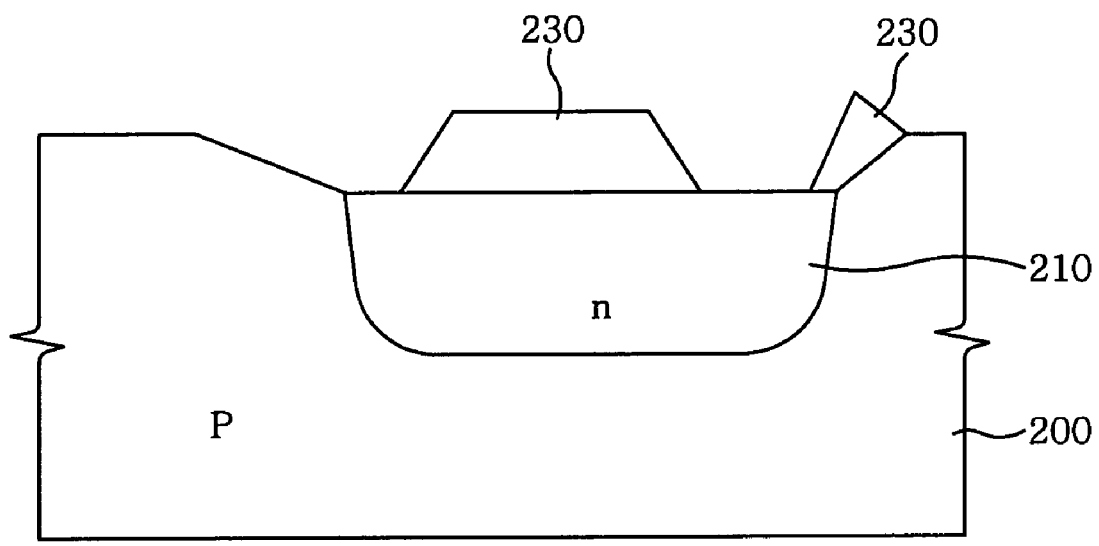
Figure 5:
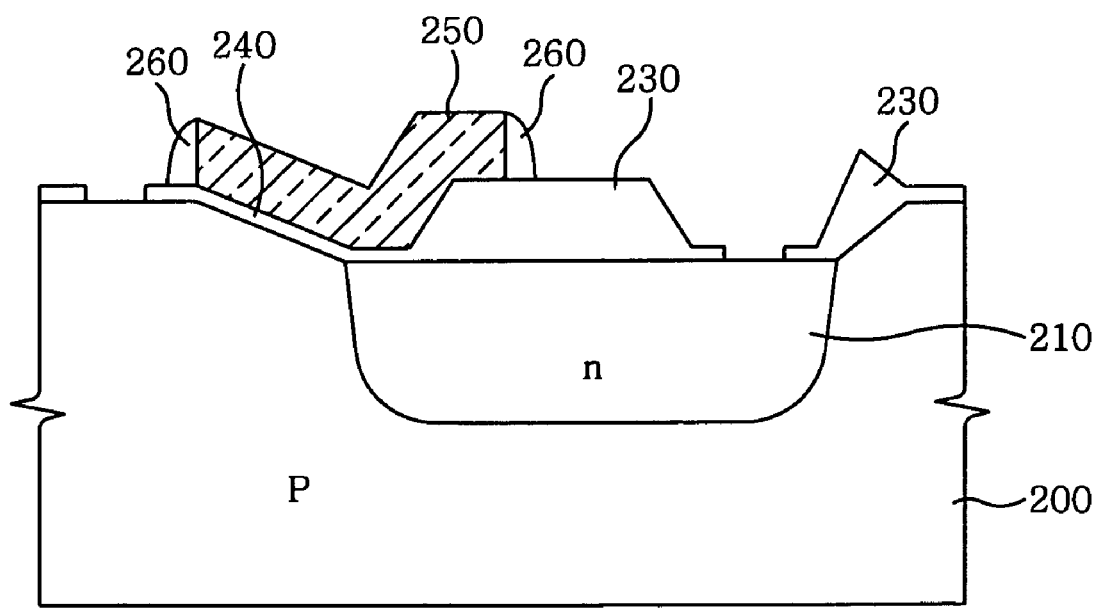

FIGS. 3 through 5 are sectional views illustrating a method for fabricating a high voltage semiconductor device consistent with an embodiment of the present invention.

Referring to FIG. 3, an n-type drift region 210 is formed on a p-type semiconductor substrate 200, by performing an ion-implantation process using a predetermined mask layer pattern. A local oxidation of silicon (LOCOS) isolation layer (not shown) and a LOCOS field plate 230 are formed on n-type drift region 210, by performing a general LOCOS process using an anti-oxidation layer such as a nitride layer. As a result of this process, both sides of field plate 230 have a sloped profile.

Referring to FIG. 4, parts of field plate 230 are removed by performing an etching process using a mask layer pattern such as a photo-resist layer pattern. The removed parts include a part having a sloped profile at one side of field plate 230, and a part adjacent to the other side of field plate 230 where a drain contact is to be formed in a subsequent process.

Referring to FIG. 5, a gate insulating layer 240 is formed on a portion of the surface of substrate 200, and a gate conductive layer is formed on the entire surface of gate insulating layer 240. The gate conductive layer may be formed of a polysilicon layer. The gate conductive layer is patterned to form a gate conductive layer pattern 250. Gate conductive layer pattern 250 is superposed above the sloped region of semiconductor substrate 200 which has been exposed as a result of patterning field plate 230. Gate conductive layer pattern 250 is patterned to extend to the top surface of field plate 230. Then, gate spacer layers 260 are formed at both sidewalls of gate conductive layer pattern 250.

Subsequently, an n+-type source region 221 and an n+-type drain region 222 are formed by performing a general ion-implantation process using an ion implantation mask layer pattern, thereby fabricating the high voltage semiconductor device illustrated in FIG. 2.

As described above, in the high voltage semiconductor device and the method for fabricating the high voltage semiconductor device, the source region is disposed higher than the drift region. Accordingly, the gate length is shortened in the horizontal direction, without decreasing a breakdown voltage, to reduce the area of the semiconductor device. Furthermore, the length of current path is shortened to reduce the ON-resistance.

While the invention has been shown and described with respect to the preferred embodiments, it will be understood by those skilled in the art that various changes and modifications may be made without departing from the spirit and scope of the invention as defined in the following claims.

What is claimed is:

1. A high voltage semiconductor device comprising:
   a semiconductor substrate of a first conductivity type, including a first region, a second region relatively lower than the first region, and a sloped region between the first region and the second region;
   a drift region of a second conductivity type, formed in the second region;
   a source region of the second conductivity type, formed in the first region and spaced apart from the drift region by the sloped region;
   a drain region of the second conductivity type, formed on the drift region;
   a field plate formed on the drift region in the second region;
   a gate insulating layer formed on the semiconductor substrate between the source region and the drain region; and
   a gate electrode layer, which is disposed on the gate insulating layer and extends above the field plate.

2. The high voltage semiconductor device of claim 1, wherein the first conductivity type is p-type, and the second conductivity type is n-type.

3. A method for fabricating a high voltage semiconductor device, comprising:
   forming a drift region of a second conductivity type, on a predetermined region of a semiconductor substrate of a first conductivity type;
   forming a local oxidation of silicon (LOCOS) field plate on a surface of the semiconductor substrate which is in contact with the drift region;
   exposing a sloped portion of the semiconductor substrate by patterning the field plate such that the drift region is placed adjacent to a lower side of the sloped portion;
   forming a gate conductive layer pattern above the exposed sloped portion of the semiconductor substrate, and forming a gate insulating layer between the gate conductive layer pattern and the semiconductor substrate; and
   forming a source region adjacent to an upper side of the sloped portion and a drain region respectively on the semiconductor substrate and the drift region.

4. The method of claim 3, wherein the gate conductive layer pattern is formed to extend to above the field plate.

5. The method of claim 3, wherein the first conductivity type is p-type, and the second conductivity type is n-type.

6. The high voltage semiconductor of claim 1, wherein a current passes below the field plate in a horizontal direction without detouring around the field plate.

* * * * *